US010348058B1

(12) United States Patent
Gwo et al.

(10) Patent No.: US 10,348,058 B1
(45) Date of Patent: Jul. 9, 2019

(54) TWO-DIMENSIONAL MATERIAL PLASMONIC LASER

(71) Applicant: National Tsing Hua University, Hsinchu (TW)

(72) Inventors: Shang-Jr Gwo, Hsin-Chu (TW); Chun-Yuan Wang, Hsin-Chu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/877,202

(22) Filed: Jan. 22, 2018

(51) Int. Cl.
| H01S 5/10 | (2006.01) |
| H01S 5/20 | (2006.01) |
| G02B 6/122 | (2006.01) |
| G02F 1/035 | (2006.01) |
| H01S 5/34 | (2006.01) |
| H01S 5/02 | (2006.01) |
| H01S 5/04 | (2006.01) |

(52) U.S. Cl.
CPC .......... *H01S 5/2031* (2013.01); *G02B 6/1225* (2013.01); *G02F 1/035* (2013.01); *H01S 5/0206* (2013.01); *H01S 5/041* (2013.01); *H01S 5/1046* (2013.01); *H01S 5/341* (2013.01); *G02F 2203/10* (2013.01)

(58) Field of Classification Search
CPC .............................. H01S 5/1046; H01S 5/341
See application file for complete search history.

(56) References Cited

U.S. PATENT DOCUMENTS

2017/0338621 A1* 11/2017 Li ..................... H01L 21/02381

OTHER PUBLICATIONS

Zhu, "Optically pumped nanolaser based on two magnetic plasmon resonance mode," Mar. 2009, Applied Physics Letters, 94, pp. 103106-1-103106-3. (Year: 2009).*
Wang, "Coherent coupling of WS2 Monolayers with metallic Photonic Nanostructures at Room Temperature," 2016, Nano Letters, pp. 4368-4374. (Year: 2016).*
Kim, "Broadband Surface Plasmon Lasing in One-dimensional Metallic Gratings on Semiconductor," Aug. 2017, Scientific reports, pp. 1-6. (Year: 2017).*

* cited by examiner

*Primary Examiner* — Michael Carter
(74) *Attorney, Agent, or Firm* — Donald E. Stout; Stout, Uxa & Buyan, LLP

(57) ABSTRACT

A two-dimensional material plasmonic laser (device) is provided with a surface plasmonic cavity and an atomically thin semiconductor monolayer gain medium disposed on the surface plasmonic cavity. Under optical pumping or electrical pumping, the surface plasmonic cavity provides a laser feedback mechanism by coupling electron-hole pairs confined in the atomically thin semiconductor monolayer gain medium and the surface plasmon modes in the dark-mode surface plasmonic cavity, and a laser light is emitted from the two-dimensional material plasmonic laser.

19 Claims, 11 Drawing Sheets

TWO-DIMENSIONAL MATERIAL PLASMONIC LASER

BACKGROUND OF THE INVENTION

1. Field of the Invention

The present invention relates to surface emitting laser, and more particularly, relates to two-dimensional material plasmonic laser.

2. Description of Related Art

Monolayer transition metal dichalcogenides (TMDCs) are promising materials for light-emitting devices because they change from indirect to direct band-gap semiconductors when passing from the multilayer (bulk) to the monolayer regime[1]. One import recent development for such devices is the demonstration of lasing by coupling monolayer TMDC gain media with high-quality-factor (high-Q, Q≈1,000-5,000) photonic cavity modes[2-4], such as defect modes in photonic crystals[2,4] and whispering-gallery modes in a microdisk[3]. However, the two-dimensional (2D) nature of monolayer TMDCs has not been fully explored in these photonic-cavity lasers. Especially, monolayer TMDCs could open up new possibilities for semiconductor surface-emitting lasers, which are efficient in light extraction and can be used to fabricate 2D microlaser arrays with low lasing threshold[5] for applications in high-speed optical communications, displays, lighting, sensing, and imaging. At present, the performance of surface-emitting lasers is limited by viable semiconductor heteroepitaxial growth, especially for the visible and long infrared spectral ranges. In contrast, the surfaces of the van der Waals monolayers (TMDCs, graphene, hexagonal boron nitride) are naturally passivated, leading to exceptional versatility in device fabrications such as formation of heterostructures via stacking and easy integration with dissimilar materials (metals, oxides, etc.).

A vertical-cavity surface-emitting laser (VCSEL) is a type of semiconductor laser diode with laser beam emission perpendicular from the top surface. The laser resonator of the vertical-cavity surface-emitting laser consists of two distributed Bragg reflector (DSR) mirrors parallel to the wafer surface with an active region consisting of one or more quantum wells for the laser light generation in between. The planar DBR-mirrors consist of layers with alternating high and low refractive indices. Each layer has a thickness of a quarter of the laser wavelength in the material. At present, the poor optical, electrical, and thermal properties of available DBR mirror materials hinder the realization of VCSELs to be used over a broad spectrum, especially for the visible and long infrared spectral ranges, severely limiting their potential applications.

To realize monolayer semiconductor surface-emitting lasers, the 2D geometry and in-plane orientation of exciton dipole moment call for an optimized design of laser cavity. Metal-based surface plasmon polariton (SPP) cavities are particularly attractive because they can concentrate the propagating SPP waves along the metallodielectric interface, allowing a near-field coupling to the tightly confined exciton transition dipole moments. Such advantages have been recognized immediately after the inception of monolayer TMDCs as an emerging 2D photonic materials[6]. Indeed, orders of magnitude enhancement in photoluminescence (PL) has been reported in a recent work[7]. However, plasmonic-cavity-enabled lasing has not yet been realized because of stringent requirements in low-loss plasmonic material and cavity design.

References: [1] Mak, K. F., Lee, C., Hone, J., Shan, J. & Heinz, T. F. Atomically thin $MoS_2$: A new direct-gap semiconductor. Phys. Rev. Lett. 105, 136805 (2010); [2] Wu, S. et al. Monolayer semiconductor nanocavity lasers with ultralow thresholds. Nature 520, 69-72 (2015); [3] Ye, Y. et al. Monolayer excitonic laser. Nat. Photonics 9, 733-737 (2015); [4] Li, Y. et al. Room-temperature continuous-wave lasing from monolayer molybdenum ditelluride integrated with a silicon nanobeam cavity. Nat. Nanotechnol. 12, to be published (2017); [5] Iga, K. Surface-emitting laser—its birth and generation of new optoelectronics field. IEEE J. Sel. Top. Quantum Electron. 6, 1201-1215 (2000); [6] Britnell, L. et al. Strong light-matter interactions in heterostructures of atomically thin films. Science, 340, 1311-1314 (2013); [7] Wang, Z. et al. Giant photoluminescence enhancement in tungsten-diselenide-gold plasmonic hybrid structures. Nat. Commun. 7, 11283 (2016); [8] Deng, H., Weih, G., Snoke, D., Bloch, J. & Yamamoto, Y. Polariton lasing vs. photon lasing in a semiconductor microcavity. Proc. Natl. Acad. Sci. USA 100, 15318-15323 (2003); [9] Nomura, M., Kumagai, N., Iwamoto, S., Ota, Y. & Arakawa, Y. Laser oscillation in a strongly coupled single-quantum-dot-nanocavity system. Nat. Phys. 6, 279-283 (2010); [10] Chernikov, A. et al. Exciton binding energy and nonhydrogenic Rydberg series in monolayer $WS_2$. Phys. Rev. Lett. 113, 076802 (2014); [11] Ye, Z. et al. Probing excitonic dark states in single-layer tungsten disulphide. Nature 513, 214-218 (2014); [12] Liu, X. et al. Strong light-matter coupling in two-dimensional atomic crystals. Nat. Photonics 9, 30-34 (2015); [13] Liu, W. et al. Strong exciton-plasmon coupling in $MoS_2$ coupled with plasmonic lattice. Nano Lett. 16, 1262-1269 (2016); [14] Wang, S. et al. Coherent coupling of $WS_2$ monolayers with metallic photonic nanostructures at room temperature. Nano Lett. 16, 4368-4374 (2016); [15] Wen, J. et al. Room-temperature strong light-matter interaction with active control in single plasmonic nanorod coupled with two-dimensional atomic crystals. Nano Lett. 17, 4689-4697 (2017); [16] Törmä, P. & Barnes, W. L. Strong coupling between surface plasmon polaritons and emitters: a review. Rep. Prog. Phys. 78, 013901 (2015); [17] Basov, D. N., Fogler, M. M. & Garcia de Abajo, F. J. Polaritons in van der Waals materials. Science, 354, aag1992 (2016); [18] Ebbesen, T. W. Hybrid light-matter states in a molecular and material science perspective. Acc. Chem. Res. 49, 2403-2412 (2016); [19] Vasa, P. et al. Coherent exciton-surface-plasmon-polariton interaction in hybrid metal-semiconductor nanostructures. Phys. Rev. Lett. 101, 116801 (2008); [20] Schlather, A. E., Large, N., Urban, A. S., Nordlander, P. & Halas, N. J. Near-field mediated plexcitonic coupling and giant Rabi splitting in individual metallic dimers. Nano Lett. 13, 3281-3286 (2013); [21] Chikkaraddy, R. et al. Single-molecule strong coupling at room temperature in plasmonic nanocavities. Nature 535, 127-130 (2016); [22] Bergman, D. J. & Stockman, M. I. Surface plasmon amplification by stimulated emission of radiation: quantum generation of coherent surface plasmons in nanosystems. Phys. Rev. Let. 90, 027402 (2003); [23] Oulton, R. F. et al. Plasmon laser at deep subwavelength scale. Nature 461, 629-632 (2009); [24] Lu, Y.-J. et al. Plasmon nanolaser using epitaxially grown silver film. Science 337, 450-453 (2012); [25] Lu, Y.-J. et al. All-color plasmonic nanolasers with ultralow thresholds: Autotuning mechanism for single-mode lasing. Nano Lett. 14, 4381-4388 (2014); [26] Zhou, W. et al. Lasing action in strongly coupled plasmonic nanocavity arrays. *Nat. Nanotechnol.* 8, 506-511 (2013); [27] Meng, X., Liu, J., Kildishev, A. V. & Shalaev, V. M. Highly directional spaser arrays for the red wavelength region. *Laser Photonics Rev.* 8, 896-903 (2014); [28] Schokker, A. H. & Koenderink, A. F. Lasing at the band edges of plasmonic lattices. *Phys. Rev. B* 90, 155452 (2014); [29] Wang, D. et al. Band-edge engineering for controlled multimodal Nanolasing in plasmonic superlattices. *Nat. Nanotechnol.* 12, 889-894 (2017); [30] Hakala, T. K. et al. Lasing in dark and bright modes of a finite-sized plasmonic lattice. *Nat. Commun.* 8, 13687 (2017); [31] A complete description of sample fabrication, methods, characterization results, and additional modeling is available as supplementary materials; [32] Wang, C.-Y. et al. Giant colloidal silver crystals for low-loss linear and nonlinear plasmonics. *Nat. Commun.* 6, 7734 (2015); [33] Shi, J. et al. Cascaded exciton energy transfer in a monolayer semiconductor lateral heterostructure assisted by surface plasmon polariton. *Nat. Commun.* 8, 35 (2017); [34] Schuller, J. A. et al. Orientation of luminescent excitons in layered nanomaterials. *Nat. Nanotechnol.* 8, 271-276 (2013); [35] Tan, W.-C., Preist, T. W., Sambles, J. R. & Wanstall, N. P. Flat surface-plasmon-polariton bands and resonant optical absorption on short-pitch metal gratings. *Phys. Rev. B* 59, 12661-12666 (1999); [36] Chen, H.-Y. et al. Far-field optical imaging of a linear array of coupled gold nanocubes: Direct visualization of dark plasmon propagating modes. *ACS Nano* 5, 8223-8229 (2011); [37] Christ, A., Tikhodeev, S. G., Gippius, N. A., Kuhl, J. & Giessen, H. Waveguide-plasmon polaritons: Strong coupling of photonic and electronic resonances in a metallic photonic crystal slab, *Phys. Rev. Lett.* 91, 183901 (2003); [38] Miyazaki, H. T. & Kurokawa, Y. Squeezing visible light waves into a 3-nm-thick and 55-nm-long plasmon cavity. *Phys. Rev. Lett.* 96, 097401 (2006); [39] Pickering, T., Hamm, J. M., Page, A. F., Wuestner, S. & Hess, O. Cavity-free plasmonic Nanolasing enabled by dispersionless stopped light. *Nat. Commun.* 5, 4972 (2014); [40] Turnbull, G. A., Andrew, P., Barnes, W. L. & Samuel, I. D. W. Photonic mode dispersion of a two-dimensional distributed feedback polymer laser. *Phys. Rev. B* 67, 165107 (2003); [41] Lee, Y.-H. et al. Synthesis and transfer of single-layer transition metal disulfides on diverse surfaces. *Nano Lett.* 13, 1852-1857 (2013); [42] Ling, X. et al. Role of the seeding promoter in $MoS_2$ growth by chemical vapor deposition. *Nano Lett.*, 14, 464-472 (2014); [43] Zhang, X., Lin, C., Tseng, Y., Huang, K. & Lee, Y.-H. Synthesis of lateral heterostructures of semiconducting atomic layers. *Nano Lett.*, 15, 410-415 (2015); [44] Wu, Y. et al. Intrinsic optical properties and enhanced plasmonic response of epitaxial silver. *Adv. Mater.* 26, 6106-6110 (2014); [45] Li, Y. et al. Measurement of the optical dielectric function of monolayer transition-metal dichalcogenides: $MoS_2$, $MoSe_2$, $WS_2$, and $WSe_2$. *Phys. Rev. B* 90, 205422 (2014); [46] Premaratne, M. & Agrawal, G. P. *Light propagation in gain media: Optical amplifiers* (Cambridge University Press, Cambridge, 2011); [47] Savona, V. et al. Quantum well excitons in semiconductor microcavities: unified treatment of weak and strong coupling regimes. *Solid-State Commun.* 93, 733-739 (1995); [48] Jayanti, S. V. et al. Low-temperature enhancement of plasmonic performance in silver films. *Opt. Mat. Exp.* 5, 1147-1155 (2015); [49] Coldren, L. A., Corzine, S. W. & Mašanović M. L. Diode lasers and photonic integrated circuits $2^{nd}$ ed. (Wiley, Hoboken, N.J., 2012); [50] Splendiani, A. et al. Emerging photoluminescence in monolayer $MoS_2$. *Nano Lett.* 10, 1271-1275 (2010); [51] Xia, F., Wang, H., Xiao, D., Dubey, M. & Ramasubramaniam, A. Two-dimensional material nanophotonics. *Nat. Photonics* 8, 899-907 (2014); [52] Mak, K. F. & Shan, J. Photonics and optoelectronics of 2D semiconductor transition metal dichalcogenides. *Nat. Photonics* 10, 216-226 (2016); [53] Zhu, B., Chen, X. & Cui, X. Exciton binding energy of monolayer $WS_2$. *Sci. Rep.* 5, 9218 (2015); [54] Amani, M. et al. Near-unity photoluminescence quantum yield in $MoS_2$. *Science* 350, 1065-1068 (2015); [55] Weisbuch, C., Nishioka, M., Ishikawa, A. & Arakawa, A. Observation of the coupled exciton-photon mode splitting in a semiconductor quantum microcavity. *Phys. Rev. Lett.* 69, 3314-3317 (1992); [56] Vasa, P. et al. Real-time observation of ultrafast Rabi oscillations between excitons and plasmons in metal nanostructures with J-aggregates. *Nat. Photonics* 7, 128-132 (2013); [57] Dufferwiel, S. Exciton-polariton in van der Waals heterostructures embedded in tunable microcavities. *Nat. Commun.* 6, 8579 (2015); [58] Zakharko, Y., Graf, A. & Zaumseil, J. Plasmonic crystals for strong light-matter coupling in carbon nanotubes. *Nano Lett.* 16, 6504-6510 (2016); [59] Christopoulos, S. et al. Room-temperature polariton lasing in semiconductor microcavities. *Phys. Rev. Lett.* 98, 126405 (2007); [60] Lai, Y.-Y., Chou, Y.-H., Lan, Y.-P., Lu, T.-C., Wang, S.-C. & Yamamoto, Y. Crossover from polariton lasing to exciton lasing in a strongly coupled ZnO microcavity. *Sci. Rep.* 6, 20581 (2016); [61] Sanvitto, D. & Kéna-Cohen, S. The road towards polaritonic devices. *Nat. Mater.* 8, 1061-1073 (2016); [62] Low, T. et al. Polaritons in layered two-dimensional materials. *Nat. Mater.* 16, 182-194 (2017); [63] Murray, W. A., Astilean, A. & Barnes, W. L. Transition from localized surface plasmon resonance to extended surface plasmon-polariton as metallic nanoparticles merge to form a periodic hole array. *Phys. Rev. B* 69, 165407 (2004); [64] Rodriguez, S. R. K. et al. Coupling bright and dark plasmonic lattice resonances. *Phys. Rev. X*1, 021019 (2011); [65] Fedutik, Y., Temnov, V. V., Schöps, O., Woggon, U. & Artemyev, M. V. Exciton-plasmon-photon conversion in plasmonic nanostructures. *Phys. Rev. Lett.* 99, 136802 (2007); [66] Wei, H., Ratchford, D., Li, X., Xu, H. & Shih, C.-K. Propagating surface plasmon induced photon emission from quantum dots. *Nano Lett.* 9, 4168-4171 (2009); [67] Ramezani, M., Lozano, G., Verschuuren, M. A. & Gómez-Rivas, J. Modified emission of extended light emitting layer by selective coupling to collective lattice resonances. *Phys. Rev. B* 94, 125406 (2016); [68] Prins, F. et al. Direct patterning of colloidal quantum-dot thin films for enhanced and spectrally selective out-coupling of emission. *Nano Lett.* 17, 1319-1325 (2017); [69] Beijnum, F. van et al. Surface plasmon lasing observed in metal hole arrays. *Phys. Rev. Lett.* 110, 206802 (2013); [70] Yang, A. et al. Unidirectional lasing from template-stripped two-dimensional plasmonic crystals. *ACS Nano* 9, 11582-111588 (2015).

SUMMARY OF THE INVENTION

In one general aspect, the present invention relates to surface emitting laser, and more particularly, relates to two-dimensional material plasmonic laser.

According to an embodiment of this invention, a two-dimensional material plasmonic laser is provided with a surface plasmonic cavity and an atomically thin semiconductor monolayer gain medium disposed on the surface plasmonic cavity. Under optical pumping or electrical pumping, the surface plasmonic cavity provides a laser feedback mechanism by coupling electron-hole pairs confined in the atomically thin semiconductor monolayer gain medium and surface plasmon modes in the surface plasmonic cavity, and a laser light is emitted from the two-dimensional material plasmonic laser.

In an embodiment, the laser light is emitted in a direction normal to the atomically thin semiconductor monolayer gain medium. In an embodiment, the plasmonic resonance wavelength of the surface plasmonic cavity can be tuned across the complete visible and infrared spectral range.

In an embodiment, the atomically thin semiconductor monolayer gain medium is a transition metal dichalcogenide monolayer with a formula $MX_2$, where M is a transition metal atom and X is a chalcogen atom. In an embodiment, the surface plasmonic cavity is composed of near-field coupled plasmonic structures. In an embodiment, the surface plasmonic cavity has a configuration comprising nanogroove gratings, spiral gratings, line patterns, dot patterns, or concentric circles.

In an embodiment, the plasmonic resonance wavelength is determined by structure parameters of the surface plasmonic cavity. In an embodiment, the surface plasmonic cavity is a nanogroove grating, and the plasmonic resonance wavelength is determined by the groove width, depth, and/or pitch of the nanogroove grating. In an embodiment, the surface plasmonic cavity is a nanogroove grating with different widths and/or depths resulting in multiple plasmonic resonances.

In an embodiment, the surface plasmonic cavity is made of silver, aluminum, gold, boron nitride, titanium nitride, graphene, or combinations thereof. In an embodiment, a strongly coupled resonance energy transfer between the surface plasmon mode and the electron-hole pairs (excitons) leading to an energy level splitting (Rabi splitting) and formation of upper (UP) and lower (LP) exciton-polaritons. In an embodiment, the laser light has a lasing linewidth less than 1 nm. In an embodiment, upper thin-film electrodes are further arranged on the atomically thin semiconductor monolayer gain medium in case of the electrical pumping. In an embodiment, one top electrode is further arranged on the atomically thin semiconductor monolayer gain medium for applying voltage versus the surface plasmonic cavity. In an embodiment, the surface plasmonic cavity comprises a pair of surface mirrors.

The success demonstration of small-footprint, open-geometry surface emitting lasers based on two-dimensional material device architectures can bring about significant advancement in integrated photonic technologies.

DETAILED DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not described in detail in order not to unnecessarily obscure the present invention. While drawings are illustrated in details, it is appreciated that the quantity of the disclosed components may be greater or less than that disclosed, except expressly restricting the amount of the components. Wherever possible, the same or similar reference numbers are used in drawings and the description to refer to the same or like parts.

Figure 1A:
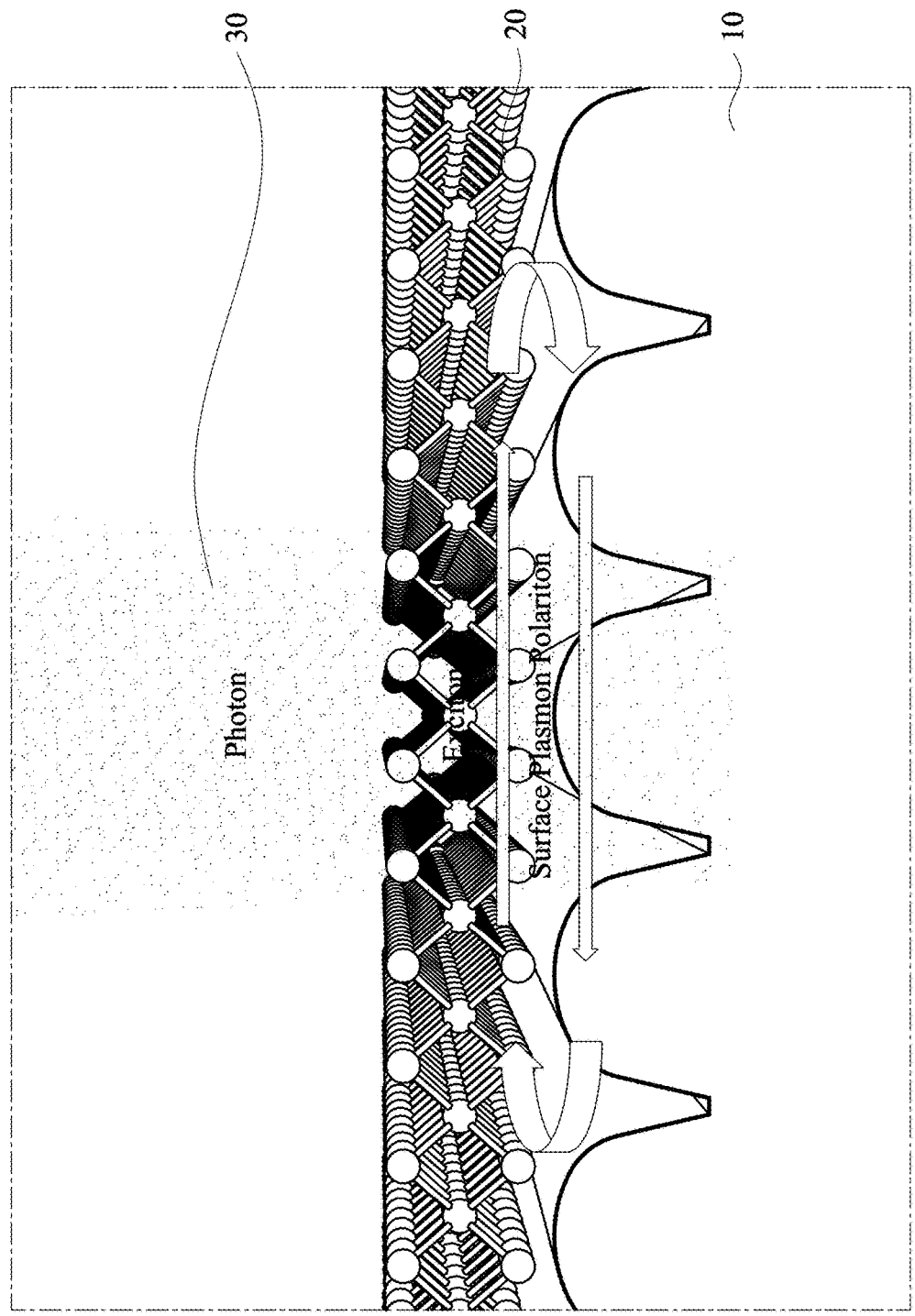
FIG. 1A is schematic drawing illustrating a surface emitting laser in accordance with an embodiment of this invention.

FIG. 1A is schematic drawing illustrating a surface emitting laser in accordance with an embodiment of this invention. Referring to FIG. 1A, a two-dimensional material plasmonic laser is provided with: a surface plasmonic cavity 10; and an atomically thin semiconductor monolayer gain medium 20 disposed on the surface plasmonic cavity. Under optical pumping or electrical pumping, the surface plasmonic cavity provides a laser feedback mechanism by coupling excitons (electron-hole pairs) confined in the atomically thin semiconductor monolayer gain medium 20 and surface plasmon modes in the surface plasmonic cavity 10, and a laser light 30 is emitted from the surface emitter laser. Preferably, the laser light is emitted in a direction essential normal to the atomically thin semiconductor monolayer gain medium 20.

Referring to FIG. 1A, the atomically thin semiconductor monolayer gain medium 20 may be, but is not limited to, transition metal dichalcogenide (TMDC) monolayers with a formula $MX_2$, where M is a transition metal atom (Mo, W, etc.) and X is a chalcogen atom (e.g., S, Se, or Te). Referring to FIG. 1A, the surface plasmonic cavity is preferably made of, but is not limited to, gold, silver, aluminum, boron nitride, titanium nitride, graphene, or combinations thereof. Referring to FIG. 1A, the surface plasmonic cavity may include, but is not limited to, nanogroove gratings, spiral gratings, line patterns, dot patterns, or concentric circles. In another embodiment, the surface plasmonic cavity includes a pair of surface mirrors. The two-dimensional material plasmonic laser may further comprise a dielectric layer (not shown) to passivate the surface plasmonic cavity 10. In addition, the two-dimensional material plasmonic laser may further comprise a dielectric layer (not shown) to passivate the atomically thin semiconductor monolayer gain medium 20. Referring to FIG. 1A, one or more thin-film electrodes (not shown) may be further provided on the atomically thin semiconductor monolayer gain medium 20 if the electrical pumping is applied. In an embodiment of this invention, the surface plasmonic cavity 10 is used as a lower thin-film electrode of the electrical pumping. In an embodiment, one top electrode is further arranged on the atomically thin semiconductor monolayer gain medium for applying voltage (or electric gating) versus the surface plasmonic cavity.

To realize 2D monolayer semiconductor surface-emitting lasers, here a preferred embodiment is proposed and demonstrated with a low-loss feedback mechanism based on surface plasmon polariton (SPP) cavities with unique coupling properties in both real- and momentum-space. In this cavity design, the SPP modes on metallic surface cavities allows for efficient 2D feedback schemes by concentrating the optical field into a subwavelength region with an enhanced in-plane field component for strong light-gain-medium interactions. Furthermore, the dark SPP modes trapped in the case of dark SPP resonators do not couple to the optical far-field, significantly reducing the radiative damping.

Figure 1B:
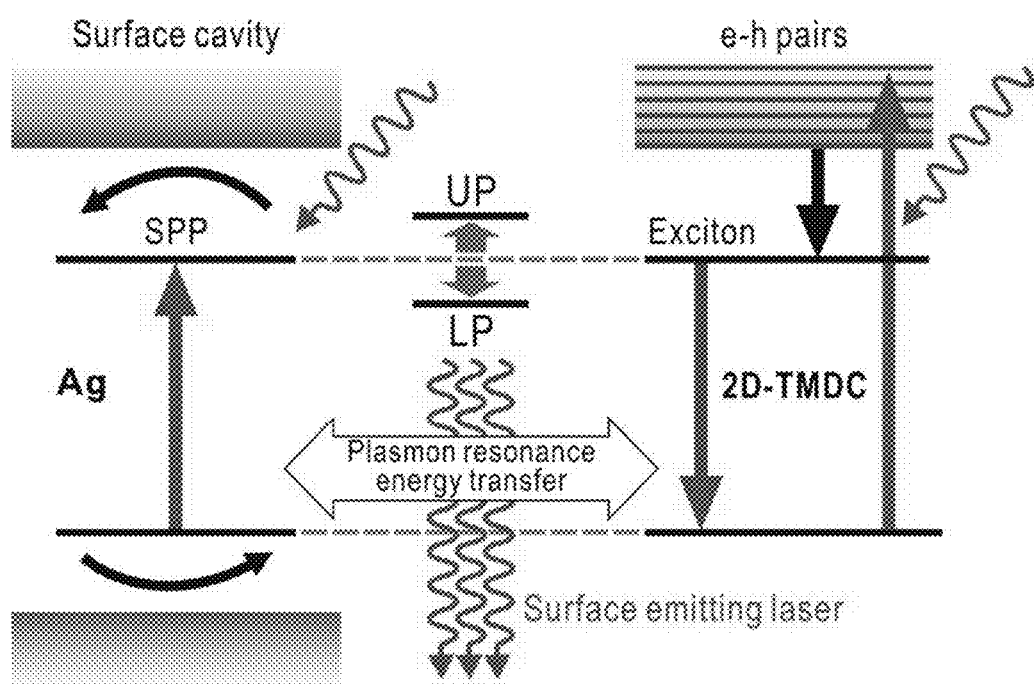
FIG. 1B is a schematic view showing energy transferring of a plasmonic-cavity surface emitting laser (PCSEL) according to a first preferred embodiment of this invention.

Plasmonic material losses in the SPP cavities are typically very high (Q<100). The embodiments of this invention use atomically smooth, single crystalline silver (Ag) as a low-loss plasmonic platform and demonstrate lasing from monolayer TMDC using two different SPP cavity designs. The adoption of surface plasmonic cavities represents a significant paradigm shift of 2D material lasers, which offer unique advantages such as subdiffraction integration and facile spectral/spatial matching with the monolayer gain medium. In comparison to the photonic counterpart, the strongly enhanced optical field and light-matter interactions in the plasmonic cavity greatly alleviate the high-Q requirement.
Plasmonic-Cavity Surface-Emitting Laser The concept of 2D material surface-emitting laser (plasmonic-cavity surface-emitting laser, PCSEL) is schematically shown in FIG. 1B. FIG. 1B is a schematic view showing energy transfer mechanism of a plasmonic-cavity surface emitting laser (PCSEL) according to a first embodiment of this invention. The PCSEL comprises a two-dimensional (2D) atomically thin transition metal dichalcogenide (TMDC) monolayer in direct contact with an ultrathin alumina($Al_2O_3$)-layer-coated silver (Ag) surface plasmonic cavity. The surface-emitting laser feedback mechanism is made possible by the resonance energy transfer process between surface plasmon polaritons (SPPs) and excitons. The resulting strong coupling leads to an energy level splitting (Rabi splitting) and formation of upper (UP) and lower (LP) exciton-polaritons (hybridized light-matter states). Under optical pumping, the laser light emits in the direction perpendicular to the TMDC monolayer surface. In the first embodiment, the PCSEL structure includes a chemical vapor deposition (CVD)-grown tungsten disulfide ($WS_2$) monolayer in direct contact with an ultrathin alumina ($Al_2O_3$)-layer-protected Ag plasmonic nanogroove grating with subwavelength grating pitch. Fourier-plane imaging shown below confirms the formation of dark SPP modes on 2D nanogroove grating cavities with flat dispersions whose resonance frequencies can be tuned over a wide spectral range. The design of SPP grating cavities allows for an efficient 2D feedback mechanism by coupling excitons (electron-hole pairs) confined in the $WS_2$ monolayer to the in-plane-polarized plasmonic mode. Furthermore, it enables surface plasmonic cavities with a large confinement factor overlapping the cavity mode with the monolayer semiconductor gain medium. For device applications, the use of surface plasmonic cavities enables the dramatic reduction of the surface-emitting laser footprint in both vertical and lateral sizes. Under strong light-matter coupling conditions, the surface plasmonic cavities enable a complete control of the emitting wavelength and polarization by lasing at a hybridized exciton-polariton state[8,9] with low lasing thresholds and narrow emission linewidths.

As the optical gain media for surface-emitting lasers, the TMDC monolayers have the advantage of exhibiting strong excitonic effects, originated from unusually large exciton binding energies in reduced dimensionality[10,11]. Moreover, their large exciton oscillator strengths ($f_{osc}$) can lead to large optical absorption coefficients and strong light-matter interaction ($\propto \sqrt{f_{osc}}$). Indeed, strong coupling of exciton and cavity photon/plasmon with large Rabi splitting ranging from a few tens to ~100 meV has been demonstrated for TMDC monolayers[12-15]. In principle, the exciton-cavity coupling strength is proportional to $\sqrt{N/V_m}$, where N is the number of emitters coupled to the cavity mode volume $V_m$[16-18]. Thus, the ultrasmall plasmonic mode volume[19-21] is particularly promising to realize strong light-matter interaction using atomically thin semiconductor media. In addition, monolayer TMDCs are excellent materials as the gain media for surface-emitting plasmonic lasers with a versatile 2D open-cavity configuration, enabling easy access to the plasmonic mode volume in which the optical processes take place.

Figure 2:
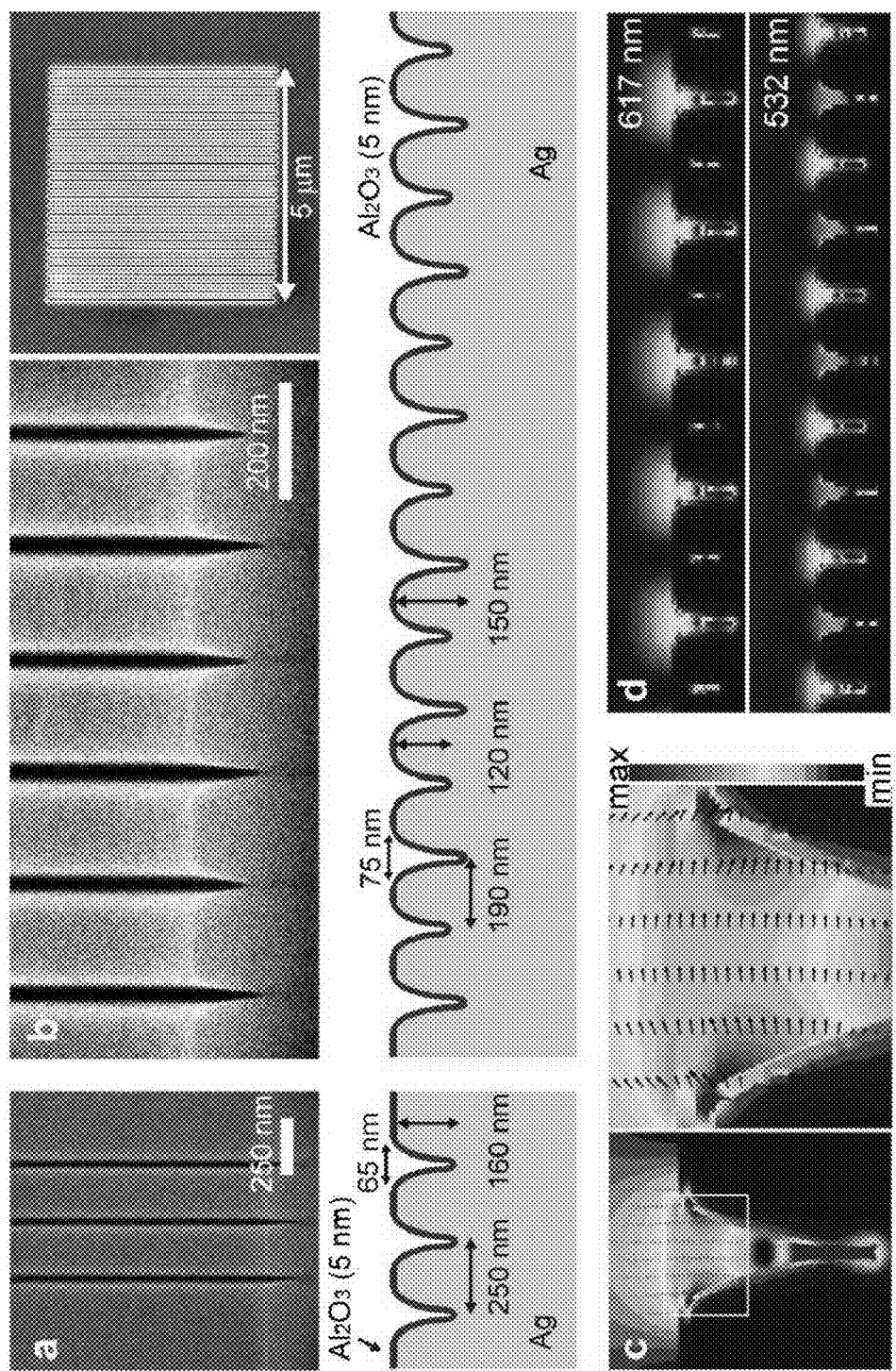
FIG. 2 shows scanning electron microscope (SEM) images and finite-difference time-domain (FDTD) simulations of the dark-mode surface plasmonic cavities according to the first embodiment of this invention.
Figure 5:
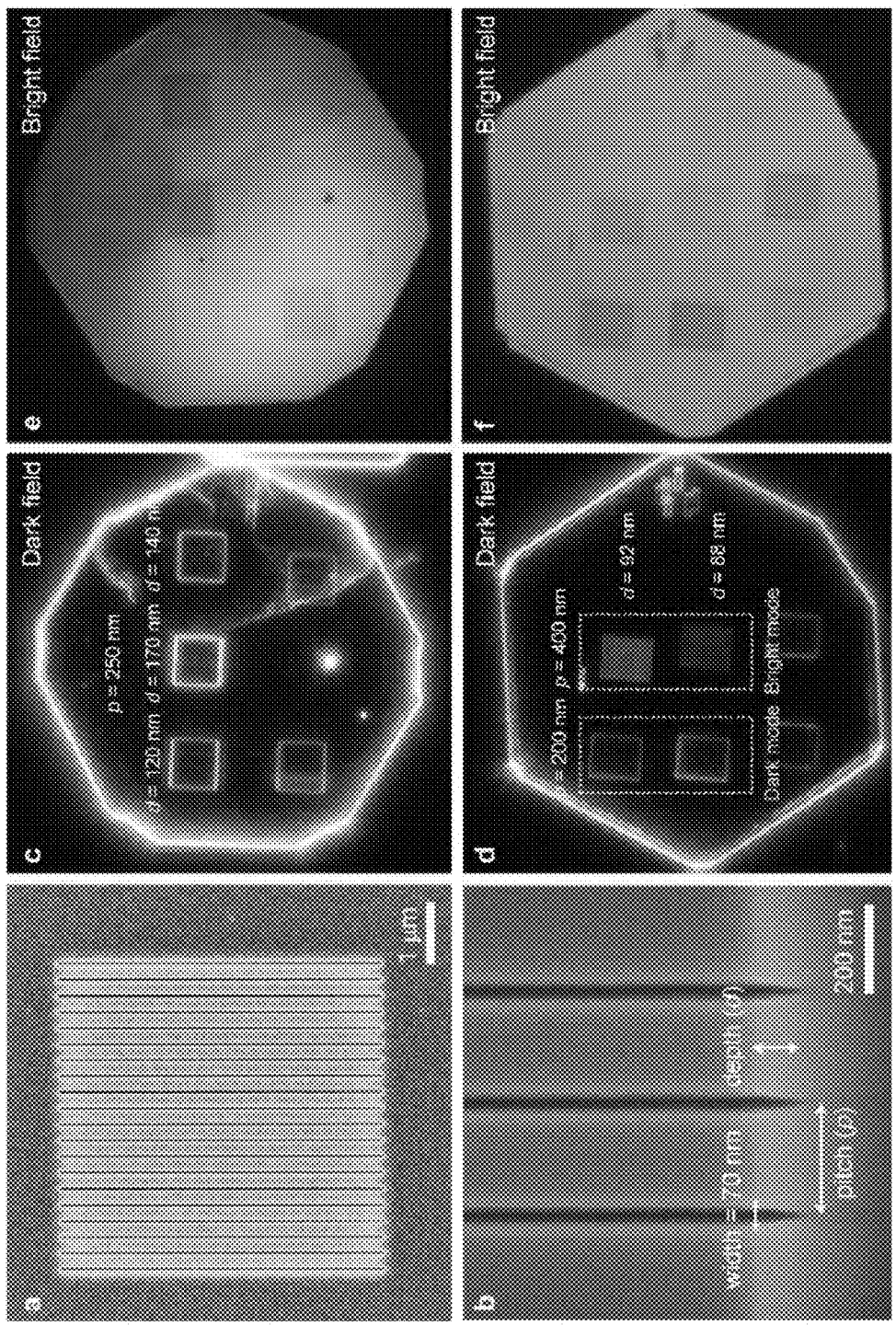
FIG. 5 shows plasmonic resonances of silver nanogroove gratings with varied groove depths and pitches according to the first embodiment of this invention.
Figure 6:
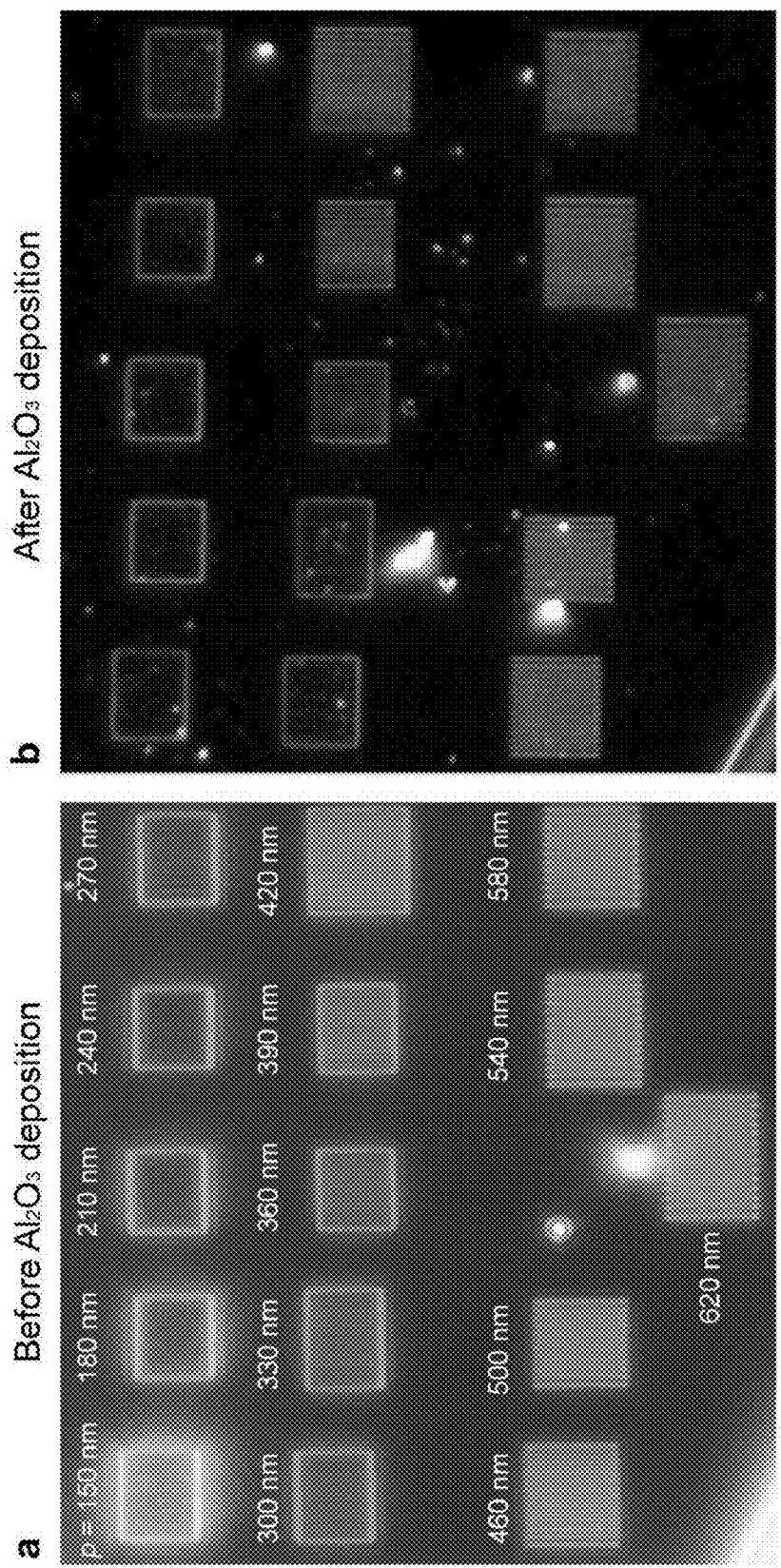
FIG. 6 shows optical dark-field images of bare Ag nanogroove gratings with continuously varying pitches according to the first embodiment of this invention.

Despite their tremendous potential, plasmonic lasers based on 2D materials are yet to be demonstrated. By adopting the spaser concept[22-30] with a metal-insulator-semiconductor plasmonic structure[23-25], here the inventers succeed in realizing the continuous-wave (CW) operation of TMDC monolayer-based PCSELs with low lasing thresholds. The key behind this success lies in the design of plasmonic cavities consisting of nanogroove gratings, which can be precisely fabricated by focused ion beam (FIB) milling[31]. Also, large single-crystalline Ag colloidal crystals were utilized to obtain ultra-long SPP propagation length and low-loss exciton-SPP coupling[32,33]. After FIB milling, conformal $Al_2O_3$ layers (~5 nm in thickness) were deposited using the atomic layer deposition (ALD) method to protect the Ag plasmonic cavities and to prevent photoluminescence (PL) quenching of deposited $WS_2$ monolayers. FIG. 2 shows scanning electron microscope (SEM) images and finite-difference time-domain (FDTD) simulations of the dark-mode surface plasmonic cavities according to the first embodiment of this invention. In which Scanning electron microscope (SEM) images and schematic diagrams of the single- and double-resonant metasurfaces used in the first embodiment are shown in FIGS. 2, a and b, respectively. Finite-difference time-domain (FDTD) simulations for the electric field distributions are shown in FIGS. 2, c and d. The double-resonant cavity is covered by one monolayer of $WS_2$. Referring to FIG. 2c, the nanogroove plasmonic structure provides an enhanced in-plane electric field, which can strongly interact with excitons in the TMDC monolayer with transition dipole moments oriented parallel to the monolayer. Referring to FIG. 2d, the resonant wavelengths are designed for both WS$_2$ lasing wavelength (617 nm, LP state) excitation and laser wavelength (532 nm). Using this design, the resonances of plasmonic grating cavities can be continuously tuned across the complete visible and infrared range with low radiative loss (FIGS. 5 and 6). Furthermore, both single- and multiple-resonant dark surface plasmonic cavity structures can be realized, enabling an efficient feedback mechanism for 2D material lasers.

Figure 7:
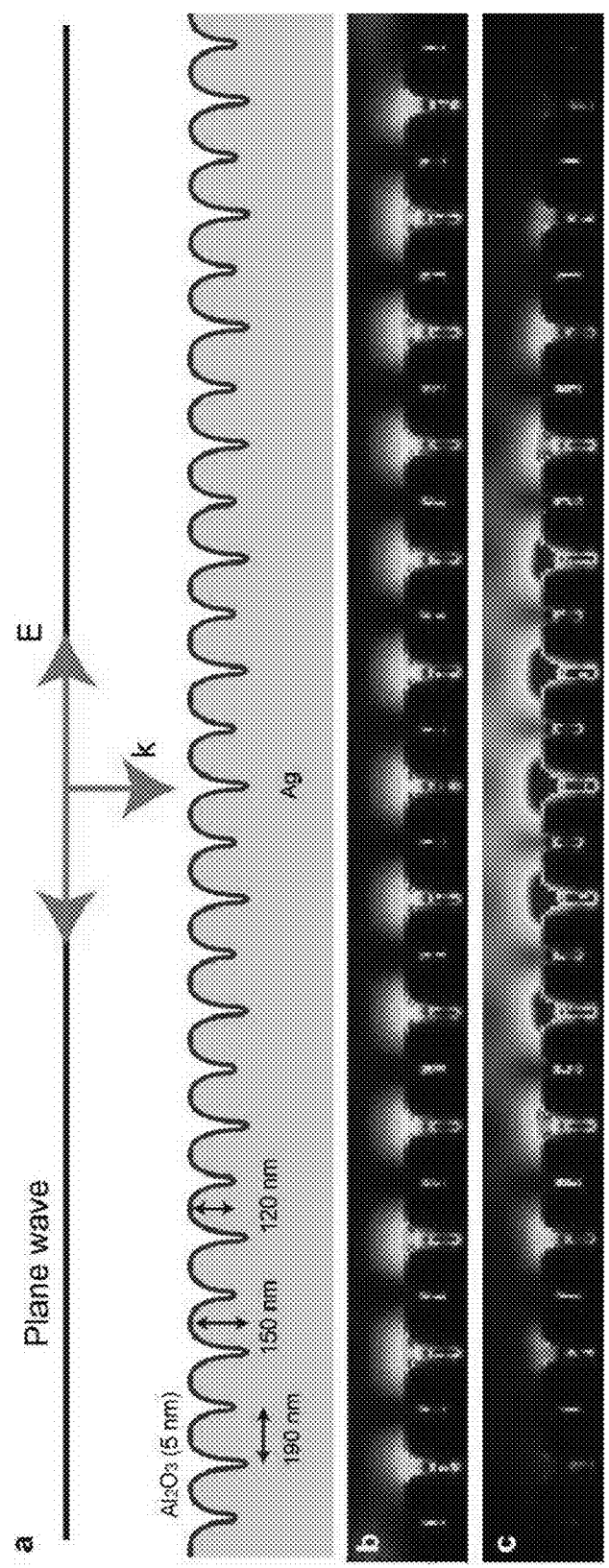
FIG. 7 shows FDTD simulations of surface plasmonic cavity mode according to the first embodiment of this invention.

The exciton-cavity coupling strength is very sensitive to the relative orientation of the cavity electric field and the dipole moments of excitons in TMDC monolayers, which have an in-plane orientation[12, 34]. In the photonic Fabry-Perot (FP) cavity, the strong interaction occurs at the antinode plane parallel to the distributed Bragg reflector mirrors[12]. For the plasmonic cavity, the electric field also needs to be in a plane parallel to the monolayer to facilitate effective coupling to excitons. The FDTD simulations shown in FIG. 2c confirm that the enhanced electric field in nanogrooves has an in-plane polarized component near the surface region, resulting in a strong exciton-SPP coupling. Additional FDTD simulations considering the 2D gain medium effect are shown in FIG. 7. FIG. 7 shows FDTD simulations of surface plasmonic cavity mode according to the first embodiment of this invention. FIG. 7a shows a schematic view of the double-resonant nanogroove grating structure. The excitation light is a uniform plane wave at normal incidence, as shown in this schematic. FIG. 7b show simulated near-field distribution of the cavity mode without the gain medium. FIG. 7c shows simulated near-field distribution of the cavity mode with a 0.7-nm-thick WS$_2$ monolayer capped on the nanogroove grating. Both simulations are performed at the excitation wavelength of 617 nm.

Surface Plasmonic Cavity

In the embodiments of this invention, the formation of dark (subradiative) and bright (radiative) modes in the Ag nanogroove cavities involves two different coupling mechanisms: (1) near-field plasmonic coupling[35, 36] of individual nanogroove modes, and (2) far-field diffractive coupling[37] of nanogroove modes and the grating mode. In both cases, the plasmonic resonance and dispersion of Ag nanogroove cavity can be precisely controlled by proper choice of the groove width (w), depth (d), and/or pitch (p). FIG. 5 shows plasmonic resonances of silver nanogroove gratings with varied groove depths and pitches according to the preferred embodiment of this invention. FIGS. 5a and 5b show SEM images of the nanogroove grating structure. The grating resonance is determined by the groove width, depth, and/or pitch. FIG. 5c shows optical dark-field image of a series of nanogroove gratings with different groove depths. The plasmonic resonance can be tuned across the complete visible and infrared spectral range. FIG. 5d shows optical dark-field image of a series of nanogroove gratings with different groove depths and pitches. The short-pitch (p=200 nm) gratings exhibit dark scattering images, while the long-pitch (p=400 nm) gratings exhibit bright scattering images. FIGS. 5e and 5f show corresponding optical bright-field images of the same grating structures shown in FIG. 5c and FIG. 5d, respectively. FIG. 6 shows optical dark-field images of bare Ag nanogroove gratings with continuously varying pitches according to the preferred embodiment of this invention. The surface plasmonic cavity mode changes from dark (subradiative) to bright (radiative) mode when the grating pitch is equal to or larger than 300 nm. In these structures, the groove width and depth are maintained at about 60 and 90 nm, respectively. These grating were freshly made via focused ion beam milling and measured without the alumina coating. These tunabilities make the surface plasmonic cavity approach promising to realize 2D material surface-emitting lasers.

To understand the coupling behavior of nanogroove arrays, the reflectance spectra of nanogroove arrays were measured with continuously varying pitches using angularly and spectrally resolved mapping via a back-focal-plane imaging technique[31]. For the optical reflectance measurements, the reflected light of a halogen lamp was collected through a polarizer so that the electric field is parallel to the grating vector [i.e., horizontal (H)-polarization]. All measurements were performed with the spectrometer entrance slit perpendicular to the grating nanogrooves.

In the case of near-field coupling, the localized plasmonic resonance of individual nanogrooves can be controlled by nanogroove width/depth[38] and it is sensitive to the change of local dielectric environment (FIG. 6). For the short-pitch nanogroove gratings with small pitches (p=150 to 330 nm,), the near-field coupling effects[35, 36] dominate and the collective mode corresponds to dark SPP waves propagating on the Ag grating surface, which does not couple into the far-field except at the cavity boundaries[30, 36]. As a result, the coupling strength between the propagating SPPs trapped in the surface cavity and the 2D excitons confined in the TMDC monolayer can be strongly enhanced. There are two prominent features observed for the dark SPP mode in the short-pitch nanogroove grating, including a spectral (blue) shift with decreasing grating pitch and a flat dispersion[35]. The later property (dispersionless) implies a very small group velocity (or stopped light in the extreme case), which can significantly enhance the light-matter interactions[39].

On the other hand, the far-field radiation of bright cavities (p=360 to 620 nm) originates from in-plane diffractive orders grazing to the plane of nanogroove grating (i.e., Wood's anomalies shown as purple dashed lines using the effective index of SPP wave propagating on the Al$_2$O$_3$-protected Ag surface[32]. In the angle-resolved reflectance spectra, mode anticrossing and splitting[37] due to strong coupling between nanogroove and grating modes can be clearly observed and the resulting coupling is highly directional, as evidenced by the presence of a large Rabi splitting (~370 meV) at the Γ point.

Strong Exciton-SPP Coupling

To date, surface plasmonic lattice lasers[26-29] and 2D distributed Bragg feedback lasers[40] reported in the literature are based on the far-field diffractive coupling mechanism, which can lead to lasing action at the band edges. However, as the diffractive coupling is through a limited region in the momentum space (k-space), the coupling efficiency might not be sufficient for an atomically thin gain medium. Here, the embodiments of this invention utilize the dark-mode surface plasmonic cavities for the realization of 2D exciton-polariton lasing. The flattened SPP band and large group index in these cavities enable efficient coupling with the atomically thin gain medium.

Figure 3:
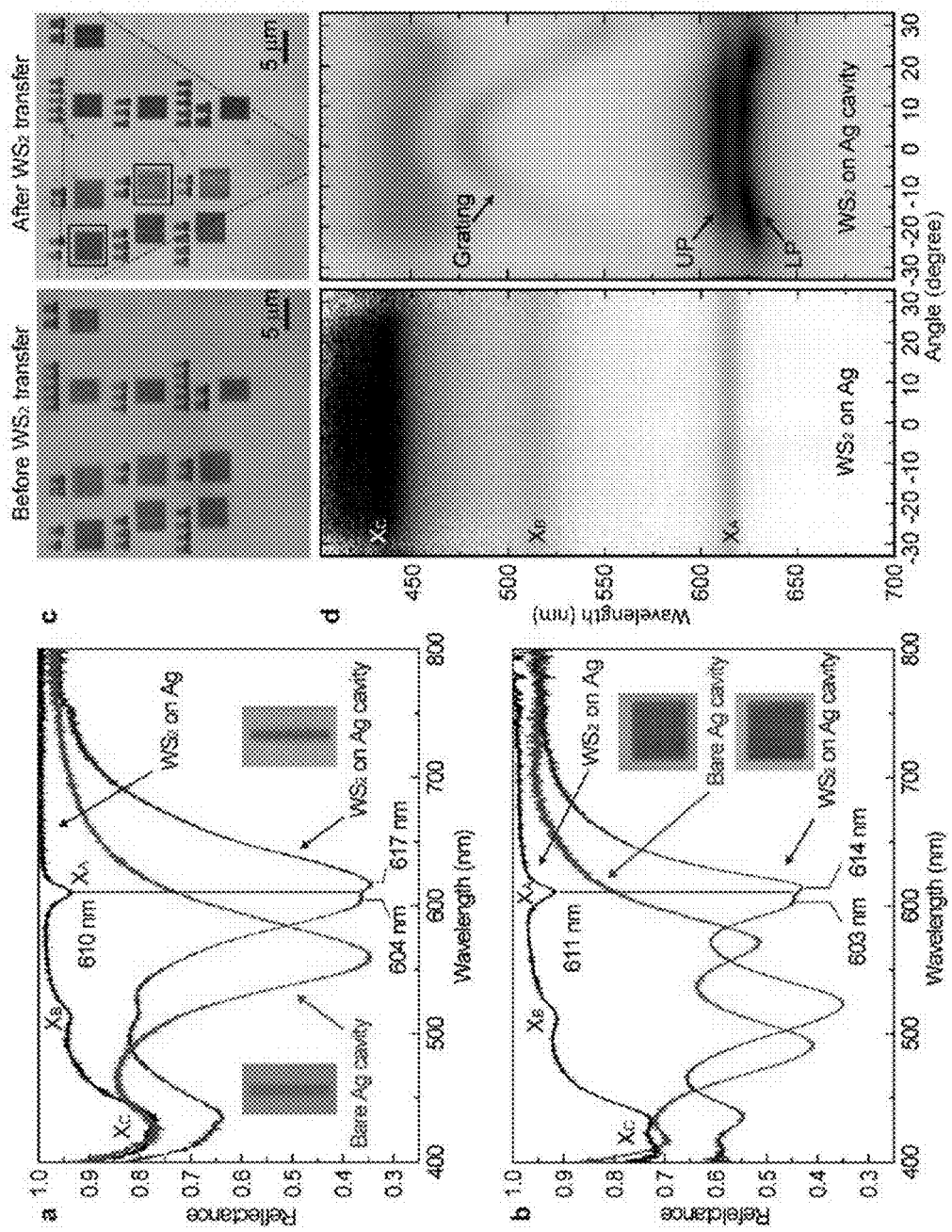
FIG. 3 shows reflectance measurement of strong exciton-polariton coupling at room temperature according to the preferred embodiment of this invention.

FIG. 3 shows reflectance measurement of strong exciton-polariton coupling at room temperature according to the preferred embodiment of this invention, and the room-temperature reflectance spectra are obtained with a white light source (a halogen lamp). In which FIG. 3a is reflectance spectra of the single-resonant cavity shown in FIG. 2a before (red curve) and after (blue curve) the transfer of monolayer WS$_2$. For comparison, the case of monolayer WS$_2$ on the unpatterned Ag substrate is shown in the black line. These spectra were normalized with respect to the reflection spectrum from the unpatterned Ag substrate. Corresponding optical microscope (OM) images are shown in the insets. FIG. 3b is a reflectance spectra of the double-resonant cavity shown in FIG. 2b. FIG. 3c are OM images showing that the reflection color of the nanogroove cavities changes dramatically after the monolayer transfer due to the sensitivity of plasmon resonance to the local dielectric environment. The structure shown in b is denoted by a blue square, while the black square denotes the structure for the angle-resolved measurements shown in d. The dotted triangular region indicates the monolayer $WS_2$. FIG. 3d is angularly and spectrally resolved reflectance mapping for a monolayer $WS_2$ on a surface plasmonic cavity.

The black resonance curves in FIGS. 3, a and b, show the room-temperature reflectance spectra obtained for $WS_2$ monolayer on unpatterned Ag substrate. Three dispersionless absorption resonances (labeled $X_A$, $X_B$, and $X_C$) can be seen, where $X_A$, $X_B$ are excitonic states originated from transitions at the K- and K'-points in the Brillourin zone and $X_C$ corresponds to excitonic transitions at the Γ point. Among TMDCs, monolayer $WS_2$ is an ideal choice for studying strong light-matter interaction and polariton lasing because of well separated $X_A$ and $X_B$ excitonic absorptions[14]. Therefore, the energy splitting resulting from the exciton-SPP coupling can be clearly resolved at room temperature, as shown in FIGS. 3, a and b. In the optical microscope images (insets), a clear reflection color change can be observed before and after the transfer of $WS_2$ monolayer onto the Ag plasmonic metasurfaces. This is due to the high sensitivity of plasmonic resonance to the local dielectric environment (comparing red and blue resonance curves in FIGS. 3, a and b), which needs to be considered when fabricating the surface plasmonic cavities to match with the specific exciton resonance. The broadband nature (low-Q) of surface plasmonic cavities is evident in FIGS. 3, a and b, which enables facile spectral matching and a wide range of detuning with the excitonic resonance in the 2D gain media, in comparison to the conventional narrowband, high-Q photonic cavities.

In the double-resonant cavity structure shown in FIG. 3b, one plasmonic resonance is designated to match (zero detuning) with the $X_A$ resonance at room temperature. The second resonance at ~532 nm is intended to match with the excitation laser wavelength for an enhanced optical pumping efficiency. Owing to the strong coupling between excitons and propagating SPP waves in dark surface plasmonic cavities, clear Rabi splittings (energy separation of two splitting states at zero detuning) can be observed at the $X_A$ exciton resonance of $WS_2$ monolayer, which are 43 and 37 meV for single- and double-resonant cavities, respectively.

The dispersionless dark cavity mode enables an efficient coupling with monolayer $WS_2$ in a wide range of k-space. Indeed, the angle-resolved reflectance mapping measured for a monolayer $WS_2$ integrated onto a double-resonant cavity with resonances at the $X_A$ and $X_C$ resonances (FIG. 3, c and d) confirm that a uniform Rabi splitting at the $X_A$ resonance occurs across a wide range of incident angles except slight deviation at large angles due to the interaction with the grating mode. Because of the angle-insensitive strong coupling, the resulting upper (UP) and lower (LP) exciton-polariton bands are also close to flat bands in a wide range of k-space (FIG. 3d), which are advantageous for 2D material lasing.

Lasing Characteristics

Figure 8:
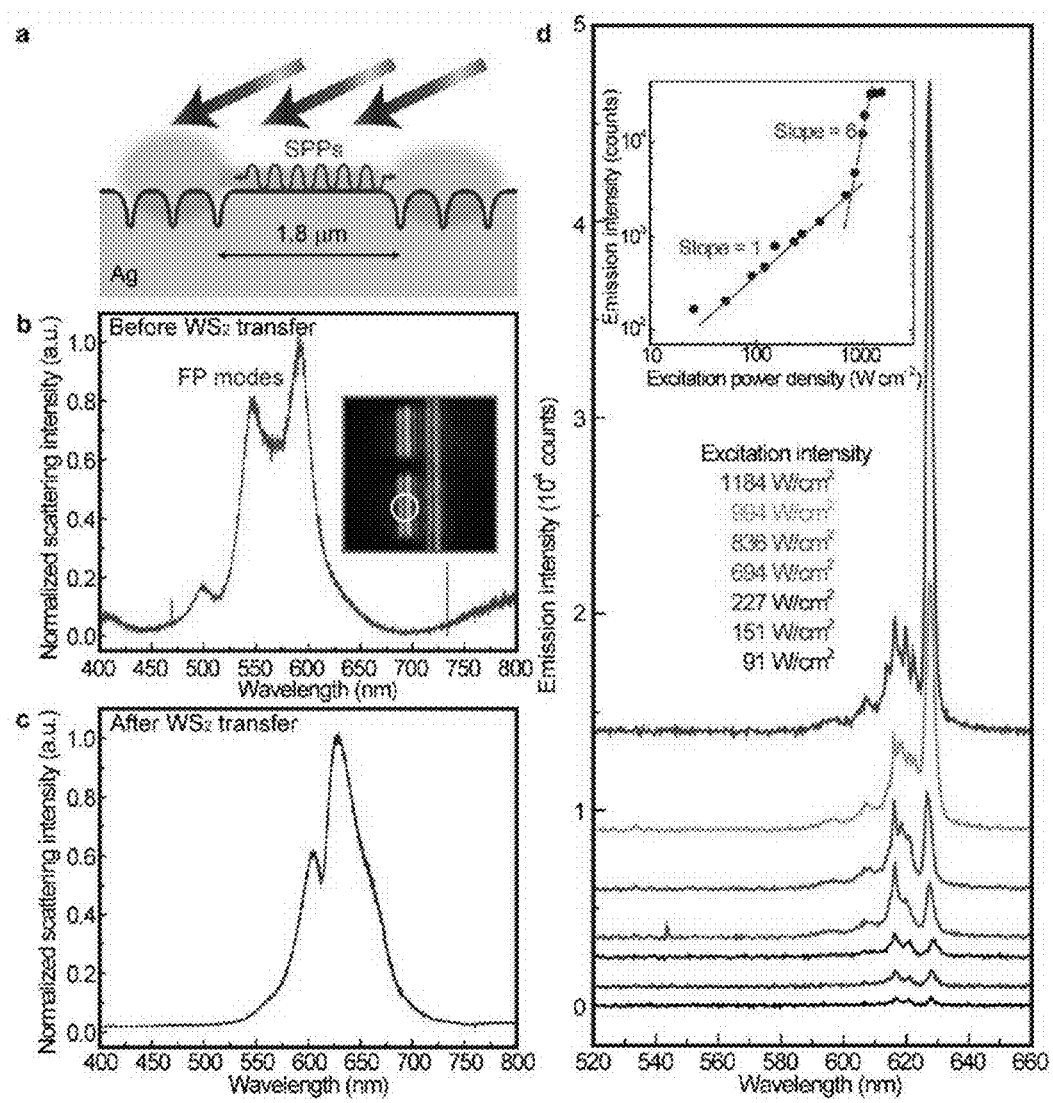
FIG. 8 shows measurements of lasing from monolayer $WS_2$ on a lateral Fabry-Perot (FP) surface cavity according to a second embodiment of this invention.

Using the dark-mode concept, the inventors have been able to demonstrate two different monolayer $WS_2$ plasmonic lasers. A second embodiment of this invention is the simplest design, in which a surface FP cavity uses a pair of lateral reflectors (the single-resonant structure shown in FIG. 3a) to confine SPPs in this surface cavity. Indeed, by coupling monolayer TMDC to such a surface FP cavity (shown in FIG. 8), one can already achieve CW lasing under optical pumping using a green (532 nm) diode laser. FIG. 8 shows measurements of lasing from monolayer $WS_2$ on a lateral Fabry-Pérot (FP) surface cavity according to a second embodiment of this invention. FIG. 8a is a schematic drawing of the white light excitation setup for measuring the FP cavity modes. FIG. 8b is the optical scattering spectrum of surface FP cavity before $WS_2$ transfer. The inset shows the optical image from the surface FP cavity structure. The white circle indicates the measurement region. FIG. 8c is the scattering spectrum of surface FP cavity after $WS_2$ transfer. There are two FP modes at 604 and 628 nm. FIG. 8d show lasing spectra measured by optical pumping using a CW 532-nm diode laser at 8 K. The inset shows the log-log plot of emission intensity vs. excitation pump density at 628 nm.

The inventors found that the lasing mode is at 628 nm, corresponding to one of the two surface FP cavity modes observed in the optical scattering spectra (FIGS. 8, b and c). An important lasing signature shown in FIG. 8d is that a strong super-linear dependence (slope≈6) of emission intensity versus excitation power density occurs at the lasing threshold (~900 W/cm$^2$) of the kinked region. In contrast, in the case of plasmonic-cavity-enabled PL enhancement from monolayer TMDC[6], a linear dependence of PL intensity was observed across a wide range of optical pump intensity, despite a giant PL enhancement factor. Moreover, mode competition can be clearly observed with increasing excitation power density (FIG. 8d). This is also an indicator for the onset of lasing. Because of the atomically thin nature of gain medium, the emission from the surface FP cavity laser shows a saturation behavior under high optical pump intensities, which prevent the observation of the "S"-shaped lasing curve ((log-log scale) in the laser input/output plot.

In comparison, using the double-resonant plasmonic cavity structure shown in FIG. 3b, the inventors could demonstrate the $WS_2$ monolayer-based surface-emitting polariton lasing with a reduced lasing threshold (~100 W/cm$^2$). Furthermore, a complete lasing curve can be measured over a wider range of optical pump intensity.

Figure 4:
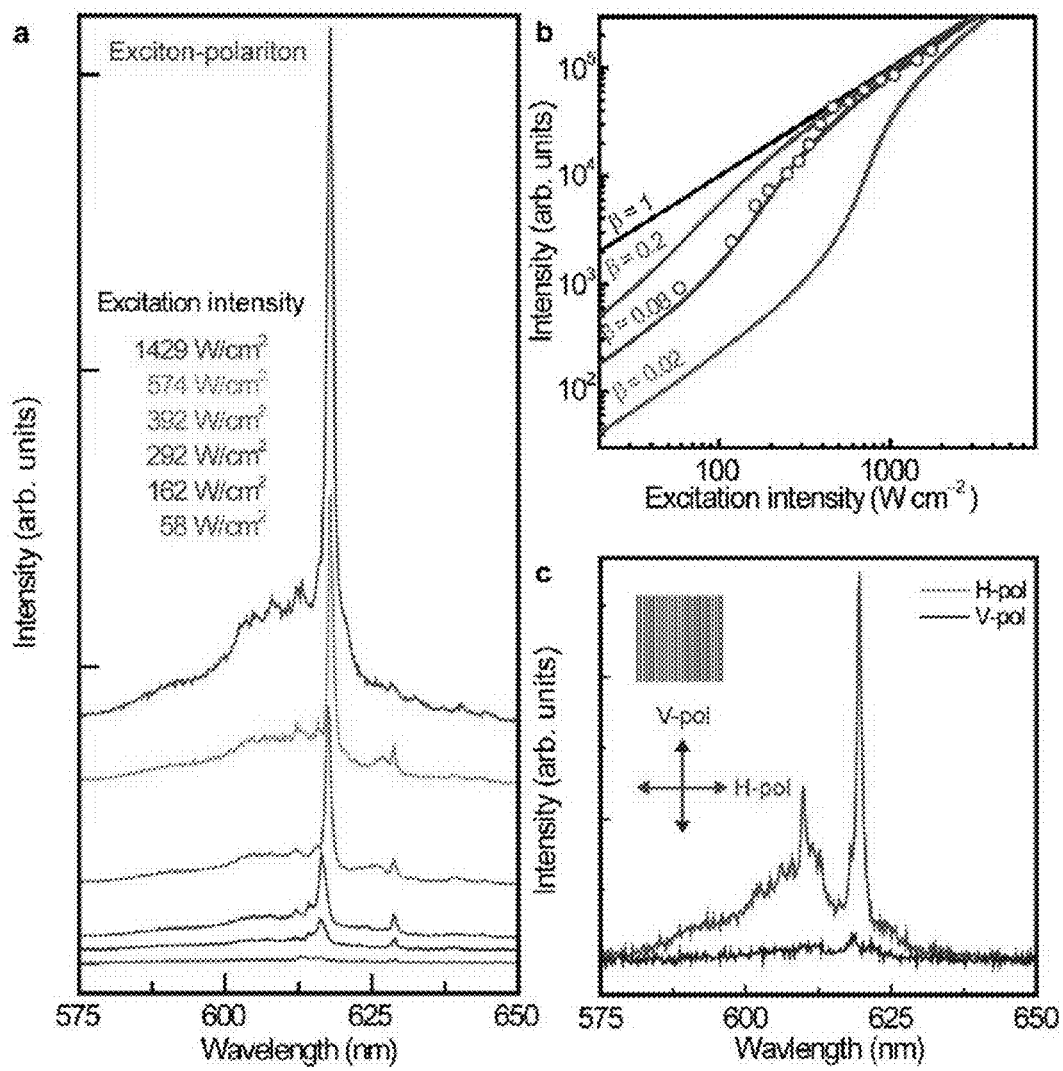
FIG. 4 shows continuous-wave (CW) surface lasing from a $WS_2$ monolayer according to the first embodiment of this invention.
Figure 9:
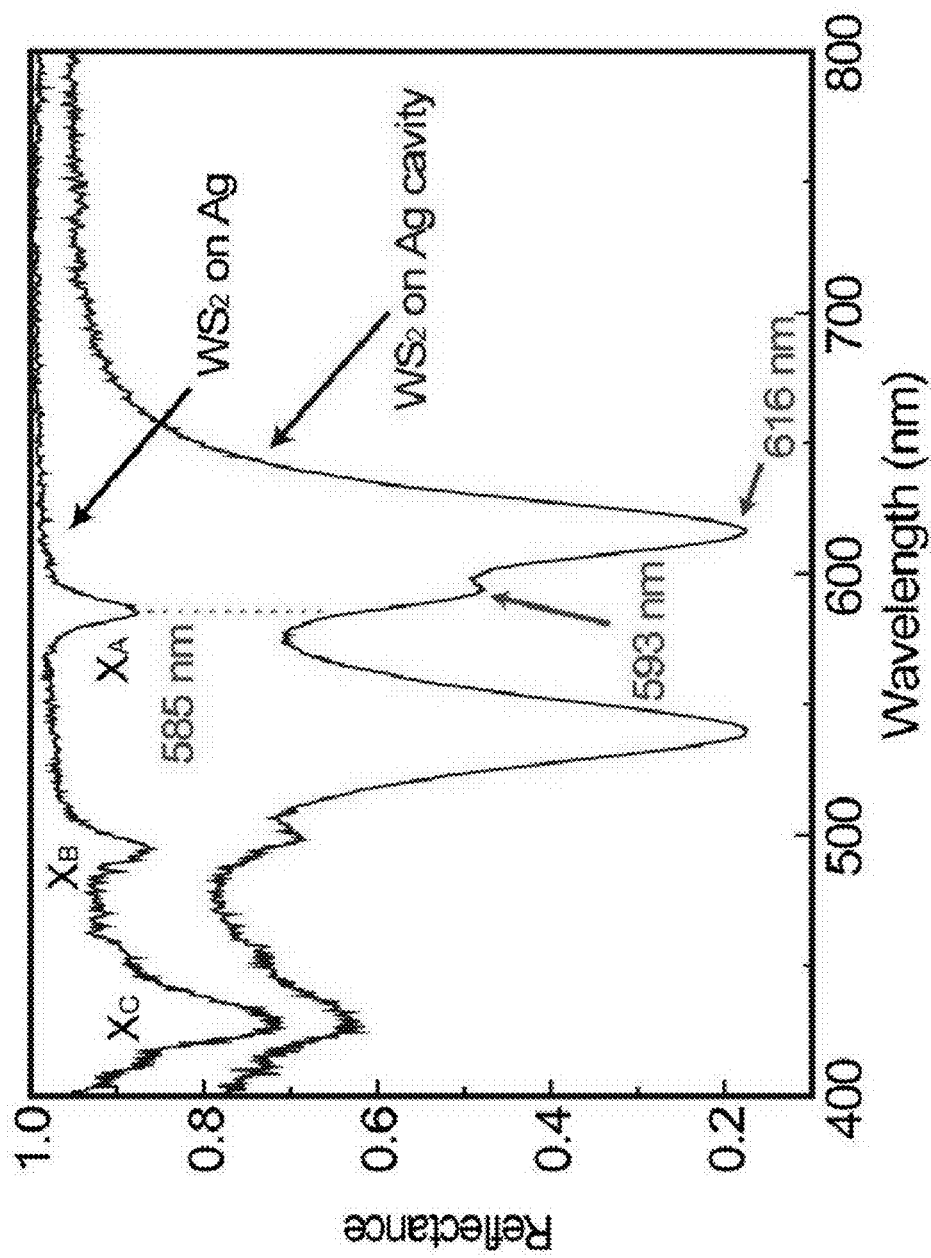
FIG. 9 shows reflectance spectrum of a double-resonant surface plasmonic cavity covered with a $WS_2$ monolayer measured at 8K according to the first embodiment of this invention.

FIG. 4 shows continuous-wave (CW) surface lasing from a $WS_2$ monolayer according to the preferred embodiment of this invention. FIG. 4a is lasing spectra measured by optical pumping using a CW 532-nm semiconductor diode laser and under a negative detuning of ~110 meV at 8 K. The optical excitation and collection of stimulated emission is performed by using a 100× objective lens (N.A.=0.82) placed inside the cryostat system. The lasing peak at 617 nm corresponds to the lower exciton-polariton (LP) state. FIG. 4b is the log-log plot of laser emission intensity vs. excitation intensity at 617 nm. The lasing linewidth can be as narrow as 0.8 nm. FIG. 4c shows the linear polarization ratio of the lasing peak (617 nm) is 92%. FIG. 9 shows reflectance spectrum of a double-resonant surface plasmonic cavity covered with a $WS_2$ monolayer measured at 8K according to the first embodiment of this invention. The exciton-polariton coupling at this temperature is under a negative detuning of ~100 meV due to the blueshift of the A-exciton resonance. In comparison to the room temperature case, the lower polariton (LP) state remains nearly around the same wavelength.

FIG. 4a shows the lasing spectra from the $WS_2$ monolayer, which is coupled to the dark Ag surface cavity mode at 8 K. In the low-temperature reflectance spectrum measured for the $WS_2$ monolayer on the Ag substrate ($WS_2$ on Ag, FIG. 9), a large blue shift of the $X_A$ excitonic resonance is observed from 611 nm (at room temperature) to 585 nm (at 8 K). In contrast, the LP state of the coupled structure remains at nearly the same wavelength (614 vs. 616 nm) because the spectral position of cavity mode is insensitive to the temperature change and the polaritonic mixed states are weighted toward the plasmonic cavity mode (WS$_2$ on Ag cavity, FIG. 9). Therefore, the lasing device is operated under a negative detuning at 8 K. Here, detuning is defined as $\Delta = E_C - E_X$, where $E_C$ is the plasmonic cavity mode energy and $E_X$ is the exciton energy. The nonresonant excitation at a large negative detuning allows us to observe the polariton lasing at the LP state. In FIG. 4a, the inventors observe intense and spectrally narrow emission with increasing optical pumping power at the LP state (617 nm), instead of the exciton resonance $X_A$ at 585 nm (absent in the emission spectra due to strong coupling). Here, the dominance of LP emission is an important distinction between polaritonic lasing and excitonic lasing. Furthermore, the log-log plot of emission intensity vs. excitation intensity at 617 nm (FIG. 4b) exhibits the expected lasing behavior.

Figure 10:
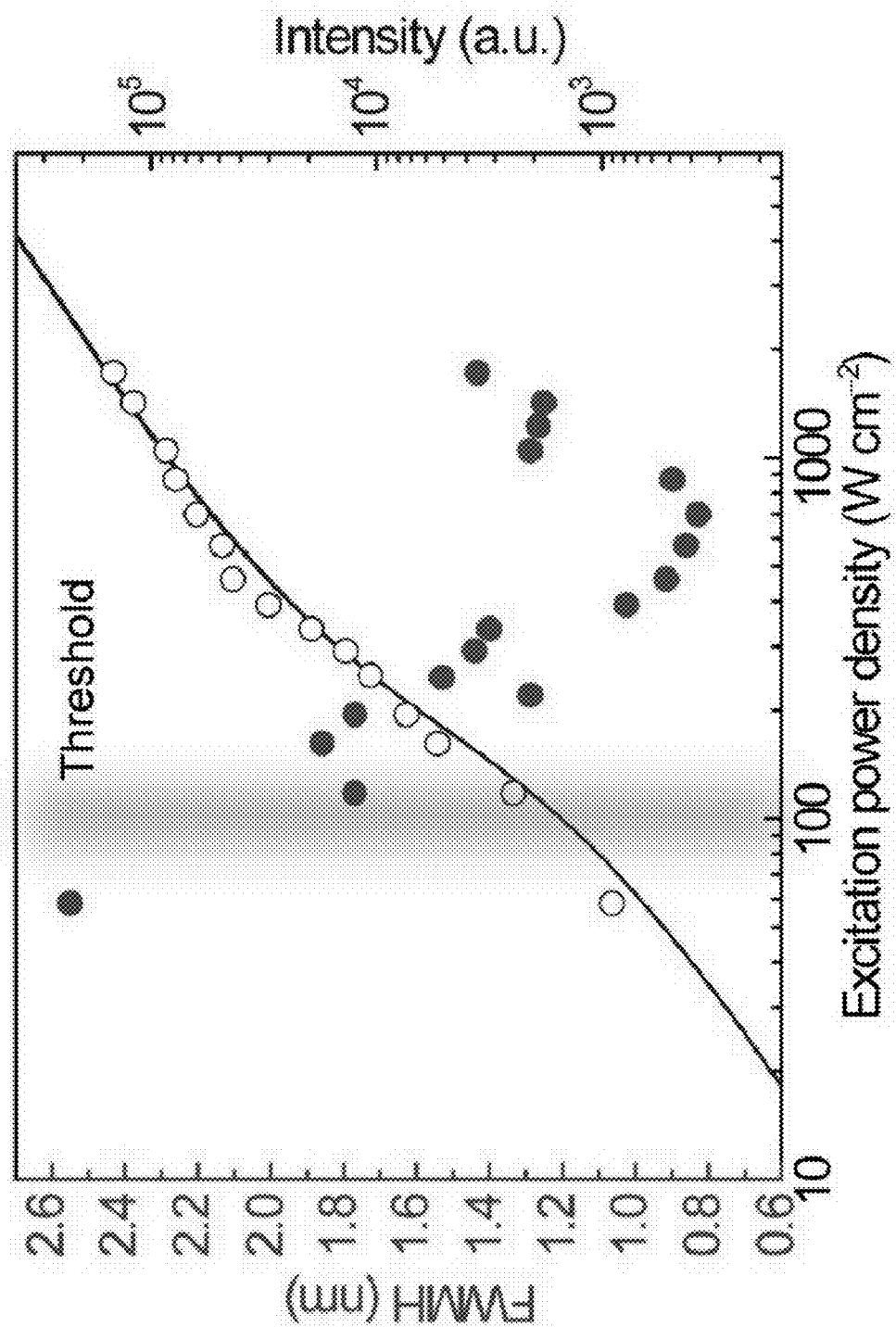
FIG. 10 shows full-width at half-maximum (FWMH) of the exciton-polariton lasing peak according to the first embodiment of this invention.

FIG. 10 shows full-width at half-maximum (FWMH) of the exciton-polariton lasing peak according to the preferred embodiment of this invention. The lasing peak starts to narrow around the lasing threshold at 100 W·cm$^{-2}$. The narrowest lasing peak reaches a FWHM width of 0.8 nm.

By fitting the experimental data using laser rate equations, a spontaneous-emission coupling factor ($\beta$) of 0.08 and an ultralow lasing threshold of 100 W/cm$^2$ (FIG. 4b) can be determined. The observed lasing characteristics can be directly related to the strong coupling between the dark surface plasmonic cavity mode and the atomically thin gain medium. Additionally, as shown in FIG. 4c, the linear polarization ratio of the lasing peak (617 nm) is as high as 92%, confirming that the observed surface lasing originates from coherent amplification by the plasmonic gap mode in the Ag nanogroove.

Besides the low lasing threshold, another important advantage of lasing under strong coupling is that very narrow emission linewidth can be obtained using a low-Q laser cavity. The initial PL linewidth from polaritonic emission is already rather narrow (~2.5 nm). Above the lasing threshold, the inventors have confirmed the concurrence of further linewidth narrowing (~0.8 nm at high pumping power) and nonlinear growth of emission intensity with increasing excitation (FIG. 10). However, there is a linewidth rebroadening with a further increase of excitation intensity. This phenomenon is often seen in nanolasers with ultrasmall mode volumes[4], especially for the case of plasmonic nanolasers[24, 25], and it can be attributed to the heating and carrier population effects. In the proof-of-concept experiments, instead of exfoliated monolayers, large CVD-grown WS$_2$ flakes were integrated onto surface plasmonic cavities by using a monolayer transfer technique[31]. This choice is motivated by the large size and uniform shape of CVD-grown monolayers, as well as high transfer controllability and reproducibility. However, the PL intensity from monolayer WS$_2$ decreases more than one order of magnitude after the transfer process, limiting the laser operation at cryogenic temperatures. Nonetheless, this is not an intrinsic device limitation since two recent works have already succeeded in demonstrating room-temperature 2D material lasers[4]. For the eventual device applications, the plasmonic cavity configuration also offers technical advantages regarding to electrical gating/injection and high heat dissipation.

In summary, the strong oscillator strength of TMDC monolayer and the ultrasmall mode volume of Ag surface plasmonic cavity jointly form an ideal hybrid material platform to realize 2D material surface emitting lasers. The dark SPP cavities are advantageous due to a 2D feedback mechanism with high coupling efficiency and low radiative loss. Using Fourier-plane mapping, the inventors have confirmed that coupling to dark propagating SPP modes in surface cavities occurs in a wide range of momentum space. The successful demonstration of surface exciton-polariton lasing opens a unique way to coherently manipulate the light-matter interaction on plasmonic metal surfaces, offering the promise of new scientific discoveries and photonic applications.

The following supplementary information describes materials and methods for forming and measuring a two-dimensional material plasmonic laser according to the preferred embodiment of this invention. While embodiments of the present invention are described with specific regard to dichalcogenide (TMDC) mamolayers, it is to be appreciated that embodiments of the invention are not so limited and that certain embodiments may also be applicable to other two-dimensional material monolayers such as allotropes of phosphorus (e.g., black phosphorus), 2D group-IV materials, 2D group-V materials, 2D oxides, and graphene oxide monolayers.

Colloidal Silver (Ag) Crystals

Colloidal silver single crystals were synthesized by using a platinum (Pt)-nanoparticle-catalyzed and ammonium hydroxide (NH$_4$OH)-controlled polyol reduction method[32]. By controlling the concentration of ammonium hydroxide, millimeter-sized single-crystalline silver plates can be grown at room temperature.

Fabrication of Nanogroove Grating Structures

Both single- and double-resonant surface plasmonic cavity structures on colloidal Ag single crystals were fabricated by using a focused ion beam (FIB) system (FEI Helios Nanolab 600i). These structures were milled at a 30-kV acceleration voltage and with an ion beam current of 1.2 pA. After the FIB fabrication, surface cavity structures were immediately capped with a 5-nm-thick Al$_2$O$_3$ conformal layer through an atom layer deposition (ALD) system.

Optical Setups for Reflectance Measurements at Room Temperature

The reflectance spectra measured for the nanogroove grating structures at room temperature were acquired by using a white light source (halogen lamp) at normal incident through a 100x objective lens (Olympus, N.A.=0.8) and a polarizer. The direction of polarizer is perpendicular to the nanogrooves (parallel to the grating vector). The reflection light was collected by the same objective lens and dispersed by a spectrometer (Andor, Shamrock 500i) equipped with a thermoelectrically cooled charge-coupled device (CCD) detector.

Optical Dark-Field Imaging

The reflected dark-field and bright-field images were acquired by using a Zeiss optical microscope. The silver grating samples were excited by a halogen lamp through a 100x (N.A.=0.75) objective lens and the scattered/reflected light was collected by the same objective lens.

Measurements of Lasing and Reflectance Characteristics at Cryogenic Temperatures Low-temperature PL and lasing measurements were performed by using a low-vibration, closed-cycle cryostats system (attocube, AttoDRY800) with a 100× objective lens (attocube, LT-APO/VIS, N.A.=0.82) inside the vacuum chamber. A continuous-wave (CW) green semiconductor diode laser at 532 nm was used as the optical excitation source with a spot size about 2 µm. The optical excitation and collection of emission from the cavity structures were carried out using the same objective lens at normal incidence, and the emission signal was dispersed by a homebuilt spectrometer equipped with a TE-cooled CCD (Andor, iDus 420). Moreover, reflectance measurements were carried out by the same system except that a halogen lamp was used as the excitation white light source.

FDTD Simulations

The inventors used a commercial FDTD package (Lumerical Solutions) to simulate the cavity properties. In these simulations, the dielectric functions of the composing materials were obtained from the following sources: the dielectric function of silver single crystal was adopted by using the experimental data for an epitaxial silver film[44]; the refraction index of $Al_2O_3$ is assumed to be 1.77; and the dielectric function of $WS_2$ monolayer was adopted by using a published experimental data set[45].

2D Plasmonic Cavity

The surface plasmonic cavity was designed using the concept of dark propagating modes via near-field coupling. There are much less radiation losses in a dark mode, in comparison to the bright mode case[36]. FIGS. 5 and 6 show the reflected dark-field images of the nanogroove grating arrays with continuously varying pitches. In the near-field coupling regime (pitch <360 nm with the $Al_2O_3$ protection layer), there is no significant scattering of light from the nanogroove gratings except at the edges of the structure. In contrast, in the far-field coupling regime, light scatters strongly from the whole grating region. Thus, the basic idea to design the dark-mode plasmonic cavity is based on the near-field coupling of individual nanogrooves. In FIG. 7, FDTD simulations are presented for comparison between a bare nanogroove grating and a loaded nanogroove grating with a monolayer of $WS_2$ as the gain medium. Here, the dielectric function of the gain medium is modeled as a Lorentzian oscillator with a negative term of oscillator strength. In comparison with a bare nanogroove grating, the simulated near-field distribution for the case with a monolayer gain medium under a uniform plane-wave excitation shows a lateral spatial distribution resulting from the dark propagating SPP modes confined in the nanogroove grating cavity.

Angularly and Spectrally Resolved Reflectance Measurements

Strong exciton-polariton coupling is essential to achieve CW, low-threshold lasing (~100 W/cm$^2$) using a single monolayer TMDC gain medium. Dispersion relations measured by angle-resolved spectroscopy allow one to characterize the strong coupling phenomenon. In FIG. 4, it shows the dispersion measurements of the dark surface plasmonic cavity covered with the monolayer $WS_2$ in the Fourier-plane using optical microscope-based reflectometry. FIG. 3d shows that in the case of $WS_2$ monolayer on an unpatterned Ag surface, exciton resonances are dispersionless. Three excitonic resonances ($X_A$, $X_B$, and $X_C$) can be clearly observed from the $WS_2$ monolayer. In comparison to the $X_A$ excitonic resonance of $WS_2$ on the unpatterned Ag substrate, the cavity-coupled exciton modes on the Ag surface cavities show strong Rabi splitting when the cavity resonance matches with the A-exciton energy of $WS_2$ (i.e., $X_A$ resonance; see FIG. 3d). Especially, the dark plasmonic mode has a flat SPP band, which allows a wide range of momentum space to be coupled with the $X_A$ excitonic resonance. This means that a large portion of emitting light from the $WS_2$ monolayer could be coupled into the dark surface plasmonic cavity mode, resulting in a reduced lasing threshold. Furthermore, the flat SPP band has a very large group index, which can lead to a large effective gain coefficient for the gain medium resided in the cavity[39, 46].

In the case of far-field, diffractive coupling, the dispersions of diffracted orders (grating modes) can be expressed by using the grating equation (Wood's anomalies): $k_{d,\|}=k_{i,\|}\pm G_m$, where $k_{i,\|}$ is incident wave vector $$\left[ = \frac{\omega}{c}\sin(\theta)\hat{e}_i; \omega, c: \right.$$

angular frequency and speed of incident light in free space; $\theta$: incident polar angle ($\theta=0$ for normal incidence); $\hat{e}_i$: in-plane unit vector along the incident direction], $k_{d,\|}$ is the diffracted wave vector $$\left[ = \frac{\omega}{c}n_{\it{eff}}\hat{e}_d; n_{\it{eff}}: \right.$$

effective index defining the phase velocity of the diffracted wave, including the far-field radiation into air from photons (photonic mode, $n_{\it{eff}}=n_{air}$) and the propagating SPPs (plasmonic mode, $n_{\it{eff}}=n_{SPP}$) on the Ag surface; $\hat{e}_d$: in-plane unit vector along the diffracted direction], and $$G_m = m\left(\frac{2\pi}{p}\right)\hat{x}$$

is the grating vector (the reciprocal lattice vector; m: integer number; in-plane unit vector perpendicular to the grating nanogrooves). It is important to recognize that Wood's anomalies are highly directional, which only can be coupled to a limited region of the momentum space (k-space). For the nanogroove gratings, using the incident excitation geometry described in terms of polar ($\theta$) and azimuthal ($\phi$; $\phi=0$ for incidence light along the $\hat{x}$ direction) angles, the Bragg scattering condition requires that $k_{d,\|}^2=k_{i,\|}^2+G_m^2\pm 2k_{i,\|}G_m\cos(\phi)$. In comparison with the plasmonic cavity under the near-field coupling conditions, the far-field-coupled plasmonic cavity (pitch=600 nm, bright mode) [Note: for simplicity, the nanogroove width and depth were fabricated to exhibit plasmonic resonance in the infrared region (outside the measured spectral range)] has a limited region of momentum space (near the $\Gamma$ point of k-space) interacting strongly with the excitonic resonance of $WS_2$ monolayer. For this nanogroove grating, the dispersion relations of the SPP modes propagating along the nanogroove grating ($\phi=0°$) are defined by the phase matching condition shown below $$k_{d,\|} = \frac{\omega}{c}n_{\it{eff}} = \left(k_{i,\|} + m\frac{2\pi}{p}\right),$$

where $k_{i,\|}=k_i\sin(\theta)=(\omega/c)\sin(\theta)$ is the in-plane wave vector of the incident light, p is the grating pitch, m is an integer, and $n_{\it{eff}}$ is effective index defining the phase velocity of the diffracted wave, including the far-field radiation from photons (photonic mode, $n_{\it{eff}}=p_{air}=1$) and propagating SPPs on the Ag surface (plasmonic mode, $n_{\it{eff}}=n_{SPP}=[(\varepsilon_{Ag}\varepsilon_{air})/(\varepsilon_{Ag}+\varepsilon_{air})]^{1/2}$, where $\varepsilon_{Ag}$ is the silver dielectric function). Thus, the dispersion relations resulting from the first-order TM modes ($\phi=0°$, m=±1) can be expressed as $$\omega_{m=+1} = +\frac{c}{n_{eff}}\left(k_{i,\|} + \frac{2\pi}{p}\right) = +\frac{c}{n_{eff}}\left(k_i \sin(\theta) + \frac{2\pi}{p}\right),$$

$$\omega_{m=-1} = -\frac{c}{n_{eff}}\left(k_{i,\|} - \frac{2\pi}{p}\right) = -\frac{c}{n_{eff}}\left(k_i \sin(\theta) - \frac{2\pi}{p}\right).$$

Substituting the experimental SPP dispersion data ($n_{eff}$) on an $Al_2O_3$ (5 nm)-protected Ag surface[32] into these formulas, the SPP dispersion curves (yellow dashed lines) can be obtained, which are in excellent agreement with our previous experimental results. This indicates that the far-field-scattered plasmonic mode contributes more to the measured reflectance and the effective index of SPPs propagating on the Ag nanogroove grating surface is close to those propagating on the unpatterned Ag surface. In the cases of first-order normal-incidence modes ($\theta=0°$ and $m=\pm1$), the mode wavelength can be simplified to $\lambda=n_{eff}p$, where $\lambda$ is $\lambda_{air}$ (photonic modes) or $\lambda_{SPP}$ (plasmonic modes). For the photonic modes ($n_{eff}=n_{air}=1$), the first-order modes intercept at $\lambda=n_{air}\cdot p=p$ (600 nm).

Low-Temperature Reflectance Measurement

At 8K, the A-exciton peak of $WS_2$ shifts to 585 nm (FIG. 9). The linewidth of plasmonic resonant peak in cavity structure becomes narrower because the metal lose is much lower at low temperature[48]. The measured optical reflectance at the $X_A$ excitonic resonance ranges from 0.35 to 0.45 at room temperature (FIGS. 3 a, b) and it is reduced to 0.20 at 8 K due to lower plasmonic losses (FIG. 9; i.e., the resonant absorption by the surface plasmonic cavity is about 80%). The inventors find that this photon trapping efficiency is sufficient to sustain the required feedback for lasing. In contrast, the DBR mirror-based surface-emitting lasers require a trapping efficiency greater than 99%.

The intent accompanying this disclosure is to have each/all embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention. Corresponding or related structure and methods disclosed or referenced herein, and/or in any and all co-pending, abandoned or patented application(s) by any of the named inventor(s) or assignee(s) of this application and invention, are incorporated herein by reference in their entireties, wherein such incorporation includes corresponding or related structure (and modifications thereof) which may be, in whole or in part, (i) operable and/or constructed with, (ii) modified by one skilled in the art to be operable and/or constructed with, and/or (iii) implemented/made/used with or in combination with, any part(s) of the present invention according to this disclosure, that of the application and references cited therein, and the knowledge and judgment of one skilled in the art.

Conditional language, such as, among others, "can," "could," "might," or "may," unless specifically stated otherwise, or otherwise understood within the context as used, is generally intended to convey that embodiments include, and in other interpretations do not include, certain features, elements and/or steps. Thus, such conditional language is not generally intended to imply that features, elements and/or steps are in any way required for one or more embodiments, or interpretations thereof, or that one or more embodiments necessarily include logic for deciding, with or without user input or prompting, whether these features, elements and/or steps are included or are to be performed in any particular embodiment.

All of the contents of the preceding documents are incorporated herein by reference in their entireties. Although the disclosure herein refers to certain illustrated embodiments, it is to be understood that these embodiments have been presented by way of example rather than limitation. For example, any of the particulars or features set out or referenced herein, or other features, including method steps and techniques, may be used with any other structure(s) and process described or referenced herein, in whole or in part, in any combination or permutation as a non-equivalent, separate, non-interchangeable aspect of this invention. Corresponding or related structure and methods specifically contemplated and disclosed herein as part of this invention, to the extent not mutually inconsistent as will be apparent from the context, this specification, and the knowledge of one skilled in the art, including, modifications thereto, which may be, in whole or in part, (i) operable and/or constructed with, (ii) modified by one skilled in the art to be operable and/or constructed with, and/or (iii) implemented/made/used with or in combination with, any parts of the present invention according to this disclosure, include: (I) any one or more parts of the above disclosed or referenced structure and methods and/or (II) subject matter of any one or more of the inventive concepts set forth herein and parts thereof, in any permutation and/or combination, include the subject matter of any one or more of the mentioned features and aspects, in any permutation and/or combination.

What is claimed is:

1. A two-dimensional material plasmonic laser, comprising:
   a surface plasmonic cavity;
   an atomically thin semiconductor monolayer gain medium disposed on the surface plasmonic cavity; and
   an electrode arranged on the atomically thin semiconductor monolayer gain medium for applying electrical voltage versus the surface plasmonic cavity;
   wherein under optical pumping or electrical pumping, the surface plasmonic cavity provides a laser feedback mechanism by coupling electron-hole pairs confined in the atomically thin semiconductor monolayer gain medium and the surface plasmon mode in the surface plasmonic cavity, and a laser light is emitted from the two-dimensional material plasmonic laser.

2. The two-dimensional material plasmonic laser as set forth in claim 1, wherein the laser light is emitted in a direction normal to the atomically thin semiconductor monolayer gain medium.

3. The two-dimensional material plasmonic laser as set forth in claim 1, wherein the plasmonic resonance wavelength of the surface plasmonic cavity can be tuned across the complete visible and infrared spectral range.

4. The two-dimensional material plasmonic laser as set forth in claim 3, wherein the plasmonic resonance wavelength is determined by structure parameters of the surface plasmonic cavity.

5. The two-dimensional material plasmonic laser as set forth in claim 4, wherein the surface plasmonic cavity is a nanogroove grating, and the plasmonic resonance wavelength is determined by the groove width, depth, and/or pitch of the nanogroove grating.

6. The two-dimensional material plasmonic laser as set forth in claim 4, wherein the surface plasmonic cavity is a nanogroove grating with different groove widths and/or depths, resulting in multiple plasmonic resonances.

7. The two-dimensional material plasmonic laser as set forth in claim 1, wherein the atomically thin semiconductor monolayer gain medium is a transition metal dichalcogenide monolayer with a formula $MX_2$, where M is a transition metal atom and X is a chalcogen atom.

8. The two-dimensional material plasmonic laser as set forth in claim 7, the surface plasmonic cavity has a first plasmonic resonance to match with an exciton resonance originated from transitions at the K-points in the Brillourin zone of atomically thin transition metal dichalcogenide monolayer gain medium.

9. The two-dimensional material plasmonic laser as set forth in claim 7, wherein the surface plasmonic cavity has a first plasmonic resonance to match with an exciton resonance and a second resonance to match with the excitation wavelength of optical pumping, where the exciton resonance originates from transitions at the K-points in the Brillourin zone of atomically thin transition metal dichalcogenide monolayer gain medium.

10. The two-dimensional material plasmonic laser as set forth in claim 1, wherein the surface plasmonic cavity is composed of near-field coupled plasmonic structures.

11. The two-dimensional material plasmonic laser as set forth in claim 1, wherein the surface plasmonic cavity has a configuration comprising nanogroove gratings, spiral gratings, line patterns, dot patterns, or concentric circles.

12. The two-dimensional material plasmonic laser as set forth in claim 1, wherein the surface plasmonic cavity is made of silver, aluminum, gold, boron nitride, titanium nitride, graphene, or combinations thereof.

13. The two-dimensional material plasmonic laser as set forth in claim 1, wherein a strongly coupled resonance energy transfer between the surface plasmon modes and the electron-hole pairs (excitons), leading to an energy level splitting (Rabi splitting) and formation of upper (UP) and lower (LP) exciton-polaritons.

14. The two-dimensional material plasmonic laser as set forth in claim 1, wherein the laser light has a lasing linewidth less than 1 nm.

15. The two-dimensional material plasmonic laser as set forth in claim 1, wherein the laser light has a lasing peak with a polarization ratio greater than 90%.

16. The two-dimensional material plasmonic laser as set forth in claim 1, further comprising a dielectric layer to passivate the surface plasmonic cavity.

17. The two-dimensional material plasmonic laser as set forth in claim 1, further comprising a dielectric layer to passivate the atomically thin semiconductor monolayer gain medium.

18. A two-dimensional material plasmonic laser, comprising:
a surface plasmonic cavity; and
an atomically thin semiconductor monolayer gain medium disposed on the surface plasmonic cavity;
wherein under optical pumping or electrical pumping, the surface plasmonic cavity provides a laser feedback mechanism by coupling electron-hole pairs confined in the atomically thin semiconductor monolayer gain medium and the surface plasmon mode in the surface plasmonic cavity, and a laser light is emitted from the two-dimensional material plasmonic laser; and
wherein the surface plasmonic cavity comprises a pair of surface mirrors.

19. A two-dimensional material plasmonic laser, comprising:
a surface plasmonic cavity; and
an atomically thin semiconductor monolayer gain medium disposed on the surface plasmonic cavity;
wherein under optical pumping or electrical pumping, the surface plasmonic cavity provides a laser feedback mechanism by coupling electron-hole pairs confined in the atomically thin semiconductor monolayer gain medium and the surface plasmon mode in the surface plasmonic cavity, and a laser light is emitted from the two-dimensional material plasmonic laser in a direction normal to the atomically thin semiconductor monolayer gain medium; and
wherein the plasmonic resonance wavelength of the surface plasmonic cavity can be tuned across the complete visible and infrared spectral range.

* * * * *